US012009368B2

(12) United States Patent
Wu

(10) Patent No.: US 12,009,368 B2
(45) Date of Patent: Jun. 11, 2024

(54) ARRAY SUBSTRATE AND DISPLAY PANEL

(71) Applicants: HKC CORPORATION LIMITED, Shenzhen (CN); CHONGQING HKC OPTOELECTRONICS TECHNOLOGY CO., LTD., Chongqing (CN)

(72) Inventor: Chuan Wu, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 614 days.

(21) Appl. No.: 17/272,941

(22) PCT Filed: Dec. 4, 2018

(86) PCT No.: PCT/CN2018/119076
§ 371 (c)(1),
(2) Date: Mar. 3, 2021

(87) PCT Pub. No.: WO2020/103191
PCT Pub. Date: May 28, 2020

(65) Prior Publication Data
US 2022/0415928 A1   Dec. 29, 2022

(30) Foreign Application Priority Data

Nov. 21, 2018 (CN) .......................... 201821940782.7

(51) Int. Cl.
*H01L 27/12* (2006.01)

(52) U.S. Cl.
CPC .................................. *H01L 27/124* (2013.01)

(58) Field of Classification Search
None
See application file for complete search history.

(56) References Cited

U.S. PATENT DOCUMENTS

2013/0292680 A1* 11/2013 Kim .................... H01L 27/1248
257/59
2016/0190157 A1* 6/2016 Tang .................. H01L 29/78669
438/158
(Continued)

FOREIGN PATENT DOCUMENTS

CN   105810692 A   7/2016
CN   106935597 A   7/2017
(Continued)

OTHER PUBLICATIONS

Yong Li, the International Searching Authority written comments, dated Aug. 2019, CN.
(Continued)

*Primary Examiner* — Shan Liu

(57) ABSTRACT

This application discloses an array substrate and a display panel. The array substrate includes a substrate, a plurality of active switches, and a transparent conductive layer. The active switches are formed above the substrate. The transparent conductive layer is formed above the active switches, and is connected to each of the active switches. Each of the active switches includes a metal layer. A hollow structure is mounted on the transparent conductive layer. The hollow structure is located in an overlapping region between the transparent conductive layer and the metal layer.

13 Claims, 3 Drawing Sheets

(56) References Cited

U.S. PATENT DOCUMENTS

| | | | | |
|---|---|---|---|---|
| 2016/0300899 A1* | 10/2016 | Zhang | ............... | H01L 29/42384 |
| 2016/0357314 A1 | 12/2016 | Liu et al. | | |
| 2019/0086592 A1* | 3/2019 | Du | .................... | G02F 1/136222 |
| 2020/0089033 A1* | 3/2020 | Li | ...................... | G02F 1/13454 |
| 2021/0118914 A1* | 4/2021 | Zhou | .................... | H01L 27/127 |

FOREIGN PATENT DOCUMENTS

| | | |
|---|---|---|
| CN | 107958910 A | 4/2018 |
| CN | 108598155 A | 9/2018 |

OTHER PUBLICATIONS

Yong Li, the International Searching Report, dated Aug. 2019, CN.

\* cited by examiner

US 12,009,368 B2

ARRAY SUBSTRATE AND DISPLAY PANEL

CROSS REFERENCE OF RELATED APPLICATIONS

This application claims the priority to the Chinese Patent Application No. CN201821940782.7, filed with National Intellectual Property Administration, PRC on Nov. 21, 2018 and entitled "ARRAY SUBSTRATE AND DISPLAY PANEL", which is incorporated herein by reference in its entirety.

TECHNICAL FIELD

This application relates to the field of display technologies, and in particular, to an array substrate and a display panel.

BACKGROUND

The statements herein only provide background information related to this application, and do not necessarily constitute the prior art.

With the development and progress of science and technology, panel displays become mainstream products of displays and are widely used due to a thin body, power-saving, and low radiation, etc. Panel displays include thin film transistor-liquid crystal displays (TFT-LCD) and organic light-emitting diode (OLED) displays, etc. There is an overlapping region between a pixel electrode and a source or a drain, and a parasitic capacitance is generated in the overlap region. An area of the overlapping region is proportional to a value of the generated parasitic capacitance, and the value of the parasitic capacitance is inversely proportional to a charging rate of the TFT and picture quality.

The charging rate of the TFT is low and the picture quality is poor.

SUMMARY

In view of the above disadvantages, a purpose of this application is to provide an array substrate and a display panel to increase a charging rate and improve picture quality.

In order to achieve the above purpose, this application provides an array substrate, including a substrate, a plurality of active switches, and a transparent conductive layer. The active switches are formed above the substrate. The transparent conductive layer is formed above the active switches, and is connected to each of the active switches. Each of the active switches includes a metal layer. A hollow structure is mounted on the transparent conductive layer and located in an overlapping region between the transparent conductive layer and the metal layer.

Optionally, the array substrate includes a data line, and the metal layer includes a source metal layer connected to the data line. The transparent conductive layer includes a first connection section, and the hollow structure includes a first hollow structure located in an overlapping region between the first connection section and the source metal layer.

Optionally, the metal layer includes a drain metal layer, and the transparent conductive layer includes a second connection section connected to the drain metal layer. The hollow structure includes a second hollow structure located in an overlapping region between the second connection section and the drain metal layer.

Optionally, the array substrate includes a passivation layer, and the metal layer includes a drain metal layer, the passivation layer being located above the drain metal layer and including a through hole, and the drain metal layer including a recess, where the second connection section is connected to and fixed in the recess by passing through the through hole.

Optionally, the drain metal layer and the second hollow structure are circular.

Optionally, the drain metal layer and the second hollow structure are concentric circles.

Optionally, the source metal layer is circular, and the first hollow structure is symmetrical with respect to a radial direction of the source metal layer.

Optionally, a shape of the first hollow structure is a strip.

Optionally, the first hollow structure is at a middle position of the first connection section.

Optionally, a shape of the first hollow structure includes a polygonal shape.

Optionally, a shape of the first hollow structure includes an arch shape.

Optionally, a shape of the second hollow structure includes a polygonal shape.

Optionally, a shape of the second hollow structure includes an arc shape.

This application further provides an array substrate, including a substrate, a plurality of active switches, and a transparent conductive layer. The active switches are formed above the substrate. The transparent conductive layer is formed above the active switches, and is connected to each of the active switches. Each of the active switches includes a metal layer. A hollow structure is mounted on the transparent conductive layer and located in an overlapping region between the transparent conductive layer and the metal layer.

The array substrate includes a data line, and the metal layer includes a source metal layer and a drain metal layer, the source metal layer being connected to the data line. The transparent conductive layer includes a first connection section, a second connection section, and a pixel electrode, the second connection section being connected to the drain metal layer, and being connected to the pixel electrode through the first connection section. The hollow structure includes a first hollow structure and a second hollow structure, the first hollow structure being located in an overlapping region between the first connection section and the source metal layer, and the second hollow structure being located in an overlapping region between the second connection section and the drain metal layer.

The array substrate further includes a passivation layer located above the drain metal layer and including a through hole, and the drain metal layer includes a recess, where the second connection section is connected to and fixed in the recess by passing through the through hole.

The drain metal layer and the second hollow structure are circular.

The drain metal layer and the second hollow structure are concentric circles.

The source metal layer is circular, and the first hollow structure is symmetrical with respect to a radial direction of the source metal layer.

A shape of the first hollow structure is a strip.

The first hollow structure is at a middle position of the first connection section.

This application further provides a display panel, including an array substrate. The array substrate includes:

a substrate;

a plurality of active switches formed above the substrate; and a transparent conductive layer formed above the active switches and connected to each of the active switches.

Each of the active switches includes a metal layer.

A hollow structure is mounted on the transparent conductive layer and located in an overlapping region between the transparent conductive layer and the metal layer.

Optionally, the array substrate includes a data line, and the metal layer includes a source metal layer connected to the data line. The transparent conductive layer includes a first connection section, and the hollow structure includes a first hollow structure located in an overlapping region between the first connection section and the source metal layer. A shape of the first hollow structure is set to a polygonal shape, a strip shape, an arc shape, or a combination of the above shapes.

Optionally, the metal layer includes a drain metal layer, and the transparent conductive layer includes a second connection section connected to the drain metal layer. The hollow structure includes a second hollow structure located in an overlapping region between the second connection section and the drain metal layer. A shape of the second hollow structure is set to a polygonal shape, a strip shape, an arc shape, or a combination of the above shapes.

In this application, since there is an overlapping region between the transparent conductive layer and the metal layer, a parasitic capacitance is generated during working, and the parasitic capacitance affects a charging rate and degrades picture quality. If an area of the overlapping region between the transparent conductive layer and the metal layer can be reduced, the generated parasitic capacitance can be reduced, so that the charging rate and the picture quality can be improved. Therefore, in this solution, a hollow structure is mounted on the transparent conductive layer in the overlapping region between the transparent conductive layer and the metal layer, so that the overlapping area between the transparent conductive layer and the metal layer is reduced.

BRIEF DESCRIPTION OF DRAWINGS

The included accompanying drawings are used for providing further understanding of the embodiments of this application, constitute a part of the specification, and are used to illustrate implementations of this application and explain the principle of this application together with literal descriptions. Apparently, the accompanying drawings in the following description show merely some embodiments of this application, and a person of ordinary skill in the art may still derive other accompanying drawings from these accompanying drawings without creative efforts. In the accompanying drawings.

DETAILED DESCRIPTION OF EMBODIMENTS

Figure 1:
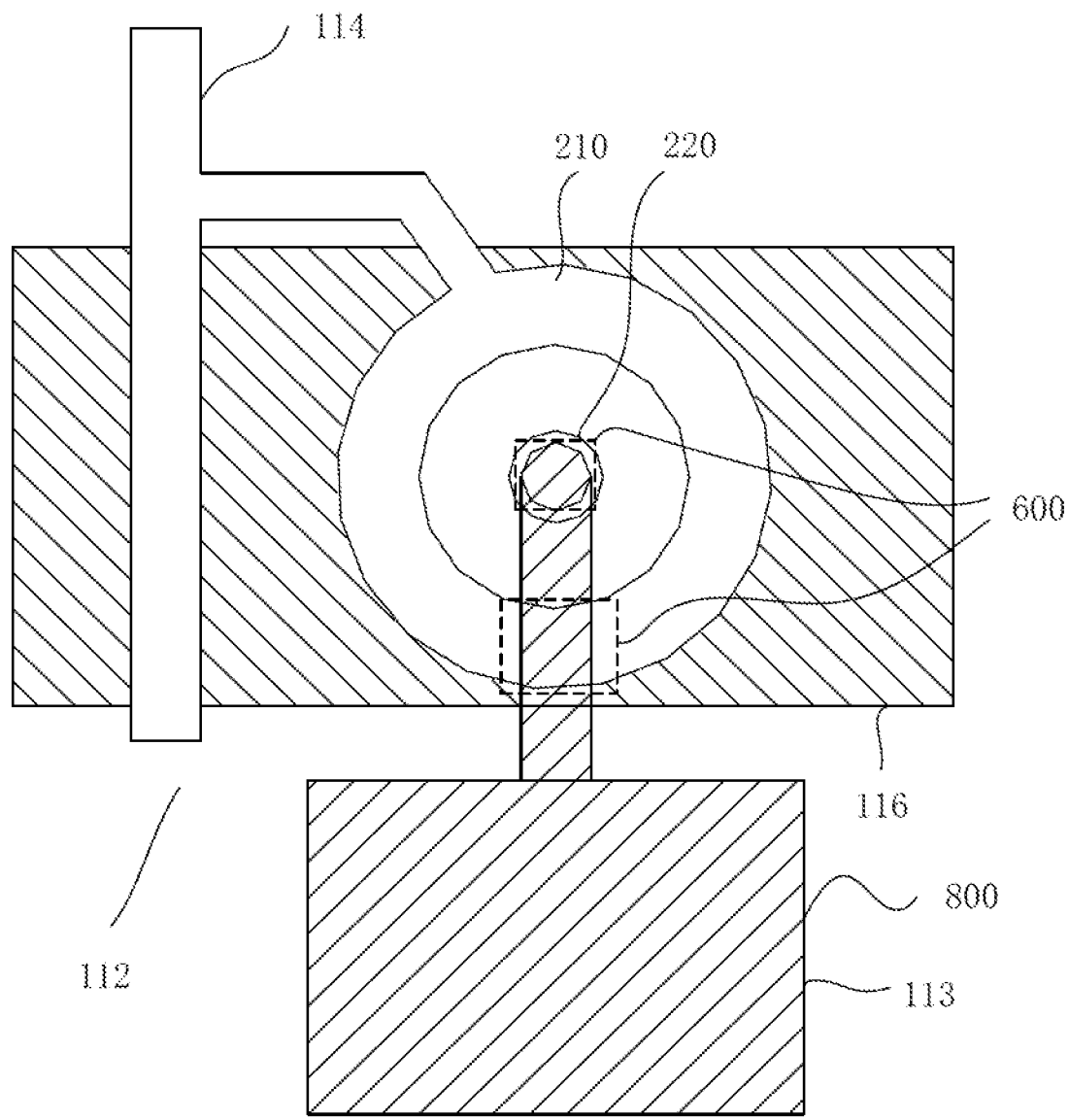
FIG. 1 is a schematic diagram of an overlapping region between circular source and drain metal layers and a transparent conductive layer according to an embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, terms "first" and "second" are only used to describe the objective and cannot be understood as indicating or implying relative importance or implying a quantity of the indicated technical features. Therefore, features defining "first" and "second" can explicitly or implicitly include one or more features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. For a person of ordinary skill in the art, the specific meanings of the foregoing terms in this application may be understood according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" used in this specification specify the presence of stated features, integers, steps, operations, elements, and/or components, but do not preclude the presence or addition of one or more other features, integers, steps, operations, elements, components, and/or combinations thereof.

In the figures, similar structures are indicated by a same reference numeral.

Figure 2:
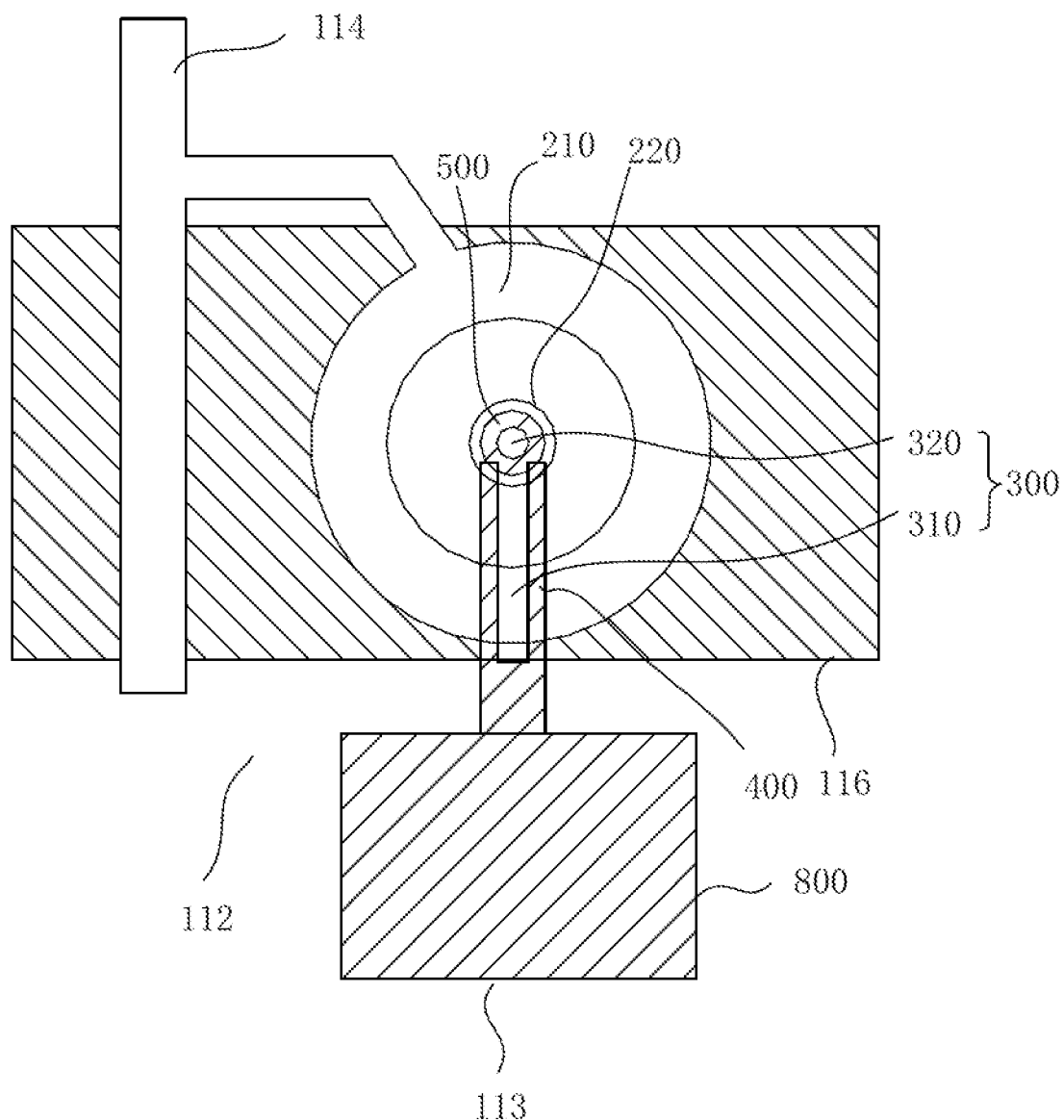
FIG. 2 is a schematic diagram of a hollow structure on an overlapping region between circular source and drain metal layers and a transparent conductive layer according to an embodiment of this application.
Figure 3:
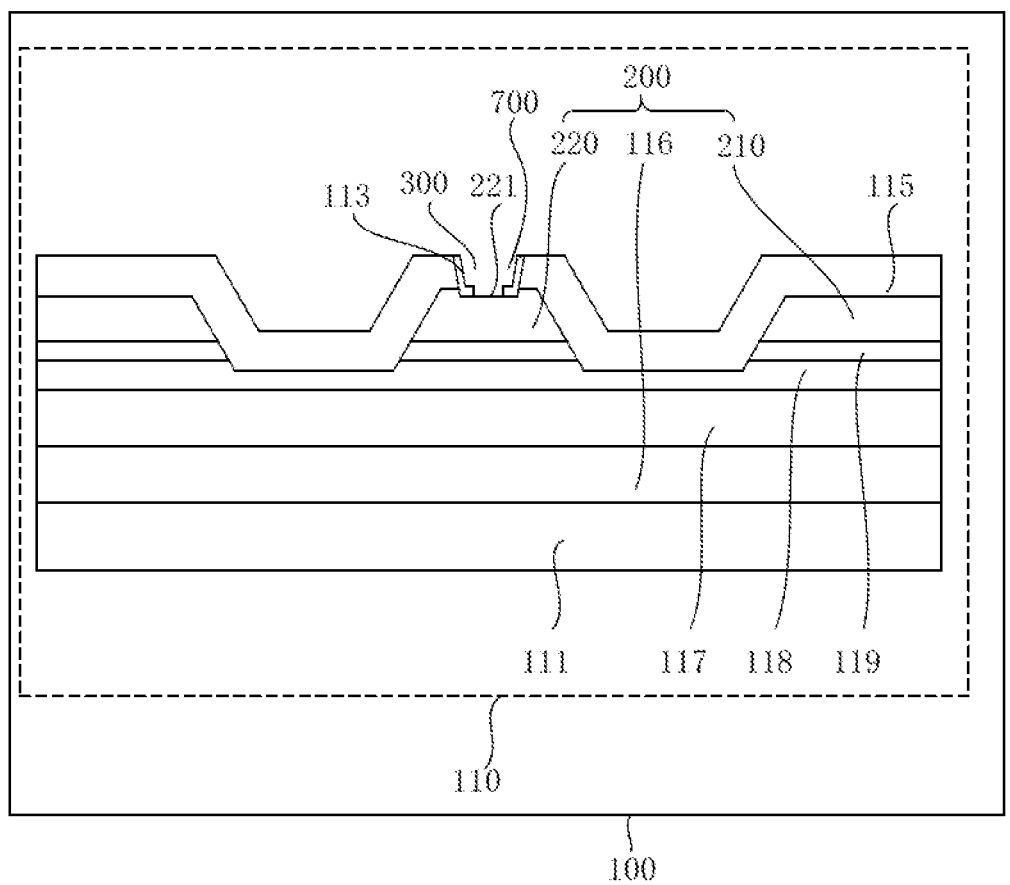
FIG. 3 is a schematic diagram of a cross-section of a hollow structure on an overlapping region between a circular source-drain metal layer and a transparent conductive layer according to an embodiment of this application.

As shown in FIG. 1 to FIG. 3, an array substrate and a display panel of this application are described in detail by using embodiments.

An array substrate 110 includes a substrate 111, a plurality of active switches 112, and a transparent conductive layer 113. The active switches 112 are formed above the substrate 111. The transparent conductive layer 113 is formed above the active switches 112 and is connected to each of the active switches 112. Each of the active switches 112 includes a metal layer 200. A hollow structure 300 is mounted on the transparent conductive layer 113. The hollow structure 300 is located in an overlapping region between the transparent conductive layer 113 and the metal layer 200.

In this solution, since there is an overlapping region 600 between the transparent conductive layer 113 and the metal layer 200, a parasitic capacitance is generated during working, and the parasitic capacitance affects a charging rate and degrades picture quality. If an area of the overlapping region 600 between the transparent conductive layer 113 and the metal layer 200 can be reduced, the generated parasitic capacitance can be reduced, so that the charging rate and the picture quality can be improved. Therefore, in this solution, a hollow structure 300 is mounted on the transparent conductive layer 113 in the overlapping region between the transparent conductive layer 113 and the metal layer 200, so that the overlapping area between the transparent conductive layer 113 and the metal layer 200 is reduced. The substrate 111 may be made of glass materials.

In one or more embodiments, the array substrate 110 includes a data line 114, and the metal layer 200 includes a source metal layer 210 connected to the data line 114. The transparent conductive layer 113 includes a first connection section 400, and the hollow structure 300 includes a first hollow structure 310 located in an overlapping region 600 between the first connection section 400 and the source metal layer 210.

In this solution, since there is an overlapping region 600 between the transparent conductive layer 113 and a drain metal layer 220, a parasitic capacitance is generated between the transparent conductive layer 113 and the drain metal layer 220 during working, affecting a charging rate and degrading picture quality. Therefore, in this solution, a hollow structure 300 is mounted on the second connection section 500 in the transparent conductive layer 113 in the overlapping region between the transparent conductive layer 113 and the drain metal layer 220, so that the overlapping area between the transparent conductive layer 113 and the drain metal layer 220 is reduced, thereby improving the charging rate and the picture quality.

In one or more embodiments, the array substrate 110 includes a passivation layer 115, and the metal layer 200 includes a drain metal layer 220. The passivation layer 115 is located above the drain metal layer 220 and includes a through hole 700. The drain metal layer 220 includes a recess 221. The second connection section 500 is connected to and fixed in the recess 221 by passing through the through hole 700.

In this solution, since the transparent conductive layer 113 needs to transmit signals, the second connection section 500 of the transparent conductive layer 113 is in contact with and connected to the drain metal layer 220. In order to ensure firmness of the connection between the second connection section 500 of the transparent conductive layer 113 and the drain metal layer 220, this solution provides a recess 221 on the drain metal layer 220, so that the second connection section 500 of the transparent conductive layer 113 is fixed in the recess 221 of the drain metal layer 220 by passing through the passivation layer 115. In this way, the second connection section 500 of the transparent conductive layer 113 is in contact with and connected to the drain metal layer 220 more firmly.

In one or more embodiments, the drain metal layer 220 and the second hollow structure 320 are circular.

In this solution, since the drain metal layer 220 is circular, the second hollow structure 320 on the second connection section 500 of the transparent conductive layer 113 is designed to be circular in this solution, not only facilitating manufacturing, but also reducing the overlapping area between the transparent conductive layer 113 and the drain metal layer 220, thereby improving the charging rate and the picture quality.

In one or more embodiments, the drain metal layer 220 and the second hollow structure 320 are concentric circles.

In this solution, because the drain metal layer 220 is circular, and the overlapping region 600 between the transparent conductive layer 113 and the drain metal layer 220 is also circular, the drain metal layer 220 and the second hollow structure 320 are set to concentric circles in this solution, so that the shape of the second hollow structure 320 is more suitable, a good design can be achieved, and area utilization is proper.

In one or more embodiments, the source metal layer 210 is circular, and the first hollow structure 310 is symmetrical with respect to a radial direction of the circular source metal layer 210.

In this solution, because the source metal layer 210 is circular, that is, a circular ring, the overlapping region 600 between the first connection section 400 of the transparent conductive layer 113 and the source metal layer 210 is a part of the circular ring, and the shape is relatively irregular. Since the transparent conductive layer 113 is configured to transmit signals, uniformity of the transparent conductive layer 113 is very important. Therefore, in this solution, the first hollow structure 310 is designed on the first connection section 400 of the transparent conductive layer 113, and is symmetrical with respect to the radial direction of the circular source metal layer 210, so that the first connection section 400 of the transparent conductive layer 113 with the first hollow structure 310 is still uniform, thereby guaranteeing stability of the signal transmission function.

In one or more embodiments, a shape of the first hollow structure 310 is a strip.

In this solution, because the first hollow structure 310 designed on the first connection section 400 of the transparent conductive layer 113 is symmetrical with respect to the radial direction of the circular source metal layer 210, as long as it is ensured that the first connection section 400 of the transparent conductive layer 113 with the first hollow structure 310 is still uniform, the stability of the signal transmission function can be guaranteed. Therefore, in this solution, the first hollow structure 310 on the first connection section 400 of the transparent conductive layer 113 is designed to a strip. Since the strip is symmetrical and structurally uniform, and the shape of the first connection section 400 of the transparent conductive layer 113 is substantially a rectangle, the elongated first hollow structure 310 matches the shape of the first connection section 400 of the transparent conductive layer 113, so that a good design can be achieved, and the area can be properly utilized.

In one or more embodiments, the first hollow structure 310 is at a middle position of the first connection section 400.

In this solution, the first hollow structure 310 is provided at the middle position of the first connection section 400 of the transparent conductive layer 113, so that the middle part is hollowed out, and the first connection sections 400 of the transparent conductive layers 113 on two sides are continuous. Therefore, the first connection section 400 of the transparent conductive layer 113 structurally still has good stability.

In one or more embodiments, a shape of the first hollow structure is a may be set to a polygonal shape or an arc shape. A shape of the second hollow structure may be set to a polygonal shape or an arc shape.

In one or more embodiments, a width of the first hollow structure 310 on the first connection section 400 is equal to a width of the second hollow structure 320 on the second connection section 500.

In this solution, because the first connection section 400 and the second connection section 500 of the transparent conductive layer 113 are an integral structure, after the hollow structure 300 is mounted on the first connection section 400 and the second connection section 500, in order to enable the transparent conductive layer 113 to still have a uniform signal transmission capability, a width of the first hollow structure 310 on the first connection section 400 and a width of the second hollow structure 320 on the second connection section 500 are set to be equal in this solution, not only facilitating manufacturing, but also reducing the overlapping areas between the transparent conductive layer 113 and the source metal layer 210 and the drain metal layer 220, thereby improving the charging rate and the picture quality.

In one or more embodiments, as shown in FIG. 3, the array substrate 110 includes: a gate metal layer 116 formed on the substrate 111; a gate insulating layer 117 formed on the gate metal layer 116; a semiconductor layer 118 formed on the gate insulating layer 117; and an ohmic contact layer 119 formed on the semiconductor layer 118, located between the semiconductor layer 118 and the source metal layer and the drain metal layer 220, and connecting the semiconductor layer 118 and the source metal layer and the drain metal layer 220.

As shown in FIG. 1 to FIG. 3, an array substrate is disclosed. The array substrate 110 includes a substrate 111, a plurality of active switches 112, and a transparent conductive layer 113.

The active switches 112 are formed above the substrate 111. The transparent conductive layer 113 is formed above the active switches 112 and is connected to each of the active switches 112. Each of the active switches 112 includes a metal layer 200. A hollow structure 300 is mounted on the transparent conductive layer 113. The hollow structure 300 is located in an overlapping region between the transparent conductive layer 113 and the metal layer 200.

The array substrate 110 includes a data line 114, and the metal layer 200 includes a source metal layer 210 and a drain metal layer 220. The source metal layer 210 is connected to the data line 114. The transparent conductive layer 113 includes a first connection section 400, a second connection section 500, and a pixel electrode 800. The second connection section 500 is connected to the drain metal layer 220, and is connected to the pixel electrode 800 through the first connection section 400. The hollow structure 300 includes a first hollow structure 310 and a second hollow structure 320. The first hollow structure 310 is located in an overlapping region 600 between the first connection section 400 and the source metal layer 210. The second hollow structure 320 is located in an overlapping region 600 between the second connection section 500 and the drain metal layer 220.

The array substrate 110 further includes a passivation layer 115. The passivation layer 115 is located above the drain metal layer 220 and includes a through hole 700. The drain metal layer 220 includes a recess 221. The second connection section 500 is connected to and fixed in the recess 221 by passing through the through hole 700.

The drain metal layer 220 and the second hollow structure 320 are circular.

The drain metal layer 220 and the second hollow structure 320 are concentric circles.

The source metal layer 210 is circular, and the first hollow structure 310 is symmetrical with respect to a radial direction of the source metal layer 210. In addition, the first hollow structure 310 has a strip shape and is at the middle position of the first connection section 400.

In this solution, since there is an overlapping region 600 between the transparent conductive layer 113 and the metal layer 200, a parasitic capacitance is generated during working, and the parasitic capacitance affects a charging rate and degrades picture quality. If an area of the overlapping region 600 between the transparent conductive layer 113 and the metal layer 200 can be reduced, the generated parasitic capacitance can be reduced, so that the charging rate and the picture quality can be improved. Therefore, in this solution, a hollow structure 300 is mounted on the transparent conductive layer 113 in the overlapping region between the transparent conductive layer 113 and the metal layer 200, so that the overlapping area between the transparent conductive layer 113 and the metal layer 200 is reduced. Since there is an overlapping region 600 between the transparent conductive layer 113 and the source metal layer 210, a parasitic capacitance is generated between the transparent conductive layer 113 and the source metal layer 210 during working, affecting a charging rate and degrading picture quality. Therefore, in this solution, a hollow structure 310 is mounted on the first connection section 400 in the transparent conductive layer 113 in the overlapping region between the transparent conductive layer 113 and the source metal layer 210, so that the overlapping area between the transparent conductive layer 113 and the source metal layer 210 is reduced, thereby improving the charging rate and the picture quality. Since there is an overlapping region 600 between the transparent conductive layer 113 and the drain metal layer 220, a parasitic capacitance is generated between the transparent conductive layer 113 and the drain metal layer 220 during working, affecting a charging rate and degrading picture quality. Therefore, in this solution, a hollow structure 320 is mounted on the second connection section 500 in the transparent conductive layer 113 in the overlapping region between the transparent conductive layer 113 and the drain metal layer 220, so that the overlapping area between the transparent conductive layer 113 and the drain metal layer 220 is reduced, thereby improving the charging rate and the picture quality. Since the transparent conductive layer 113 needs to transmit signals, the second connection section 500 of the transparent conductive layer 113 is in contact with and connected to the drain metal layer 220. In order to ensure firmness of the connection between the second connection section 500 of the transparent conductive layer 113 and the drain metal layer 220, this solution provides a recess 221 on the drain metal layer 220, so that the second connection section 500 of the transparent conductive layer 113 is fixed in the recess 221 of the drain metal layer 220 by passing through the passivation layer 115. In this way, the second connection section 500 of the transparent conductive layer 113 is in contact with and connected to the drain metal layer 220 more firmly. Since the drain metal layer 220 is circular, and the overlapping region 600 between the transparent conductive layer 113 and the drain metal layer 220 is also circular, the second hollow structure 320 on the second connection section 500 of the transparent conductive layer 113 is designed to be circular in this solution, not only facilitating manufacturing, but also reducing the overlapping area between the transparent conductive layer 113 and the drain metal layer 220, thereby improving the charging rate and the picture quality. Because the drain metal layer 220 is circular, and the overlapping region 600 between the transparent conductive layer 113 and the drain metal layer 220 is also circular, the second hollow structure 320, the drain metal layer 220, and the overlapping region 600 between the transparent conductive layer 113 and the drain metal layer 220 are set to concentric circles in this solution, so that the shape of the second hollow structure 320 is more suitable, a good design can be achieved, and area utilization is proper. Because the source metal layer 210 is circular, that is, a circular ring, the overlapping region 600 between the first connection section 400 of the transparent conductive layer 113 and the source metal layer 210 is a part of the circular ring, and the shape is relatively irregular. Since the transparent conductive layer 113 is configured to transmit signals, uniformity of the transparent conductive layer 113 is very important. Therefore, in this solution, the first hollow structure 310 is designed on the first connection section 400 of the transparent conductive layer 113, and is symmetrical with respect to the radial direction of the circular source metal layer 210, so that the first connection section 400 of the transparent conductive layer 113 with the first hollow structure 310 is still uniform, thereby guaranteeing stability of the signal transmission function. Because the first hollow structure 310 designed on the first connection section 400 of the transparent conductive layer 113 is symmetrical with respect to the radial direction of the circular source metal layer 210, as long as it is ensured that the first connection section 400 of the transparent conductive layer 113 with the first hollow structure 310 is still uniform, the stability of the signal transmission function can be guaranteed. Therefore, in this solution, the first hollow structure 310 on the first connection section 400 of the transparent conductive layer 113 is designed to a strip. Since the strip is symmetrical and structurally uniform, and the shape of the first connection section 400 of the transparent conductive layer 113 is substantially a rectangle, the elongated first hollow structure 310 matches the shape of the first connection section 400 of the transparent conductive layer 113, so that a good design can be achieved, and the area can be properly utilized. The elongated first hollow structure 310 is provided at the middle position of the first connection section 400 of the transparent conductive layer 113, so that the middle part is hollowed out, and the first connection sections 400 of the transparent conductive layers 113 on two sides are continuous. Therefore, the first connection section 400 of the transparent conductive layer 113 structurally still has good stability.

As shown in FIG. 1 to FIG. 3, a display panel 100 is disclosed. The display panel 100 includes an array substrate 110. The array substrate 110 includes a substrate 111, a plurality of active switches 112, and a transparent conductive layer 113. The active switches 112 are formed above the substrate 111. The transparent conductive layer 113 is formed above the active switches 112 and is connected to each of the active switches 112. Each of the active switches 112 includes a metal layer 200. A hollow structure 300 is mounted on the transparent conductive layer 113. The hollow structure 300 is located in an overlapping region between the transparent conductive layer 113 and the metal layer 200.

In this solution, since there is an overlapping region 600 between the transparent conductive layer 113 and the metal layer 200, a parasitic capacitance is generated during working, and the parasitic capacitance affects a charging rate and degrades picture quality. If an area of the overlapping region 600 between the transparent conductive layer 113 and the metal layer 200 can be reduced, the generated parasitic capacitance can be reduced, so that the charging rate and the picture quality can be improved. Therefore, in this solution, a hollow structure 300 is mounted on the transparent conductive layer 113 in the overlapping region between the transparent conductive layer 113 and the metal layer 200, so that the overlapping area between the transparent conductive layer 113 and the metal layer 200 is reduced. The substrate 111 may be made of glass materials.

In one or more embodiments, the array substrate 110 includes a data line 114, and the metal layer 200 includes a source metal layer 210 connected to the data line 114. The transparent conductive layer 113 includes a first connection section 400, and the hollow structure 300 includes a first hollow structure 310 located in an overlapping region 600 between the first connection section 400 and the source metal layer 210. A shape of the first hollow structure 310 is set to a polygonal shape, a strip shape, an arc shape, or a combination of the above shapes.

In this solution, since there is an overlapping region 600 between the transparent conductive layer 113 and a drain metal layer 220, a parasitic capacitance is generated between the transparent conductive layer 113 and the drain metal layer 220 during working, affecting a charging rate and degrading picture quality. Therefore, in this solution, a hollow structure 300 is mounted on the second connection section 500 in the transparent conductive layer 113 in the overlapping region between the transparent conductive layer 113 and the drain metal layer 220, so that the overlapping area between the transparent conductive layer 113 and the drain metal layer 220 is reduced, thereby improving the charging rate and the picture quality. A shape of the first hollow structure 310 is set to a polygonal shape, a strip shape, an arc shape, or a combination of the above shapes, so as to adapt to a use environment and perform functions well.

In one or more embodiments, the metal layer 200 includes a drain metal layer 220, and the transparent conductive layer 113 includes a second connection section 500 connected to the drain metal layer 220. The hollow structure 300 includes a second hollow structure 320 located in an overlapping region 600 between the second connection section 500 and the drain metal layer 220. A shape of the second hollow structure 320 is set to a polygonal shape, a strip shape, an arc shape, or a combination of the above shapes.

In this solution, since there is an overlapping region 600 between the transparent conductive layer 113 and the drain metal layer 220, a parasitic capacitance is generated between the transparent conductive layer 113 and the drain metal layer 220 during working, affecting a charging rate and degrading picture quality. Therefore, in this solution, a hollow structure 300 is mounted on the second connection section 500 in the transparent conductive layer 113 in the overlapping region between the transparent conductive layer 113 and the drain metal layer 220, so that the overlapping area between the transparent conductive layer 113 and the drain metal layer 220 is reduced, thereby improving the charging rate and the picture quality. A shape of the second hollow structure 320 is set to a polygonal shape, a strip shape, an arc shape, or a combination of the above shapes, so as to adapt to a use environment and perform functions well.

The foregoing content describes this application in detail with reference to the specific implementation manners, and it should not be regarded that the specific implementations of this application are limited to these descriptions. A person of ordinary skill in the art to which this application belongs can further make simple deductions or replacements without departing from the concept of the utility model, and such deductions or replacements should all be considered as falling within the protection scope of this application.

What is claimed is:

1. An array substrate, comprising:
a substrate;

a plurality of active switches formed above the substrate; and
a transparent conductive layer formed above the active switches and connected to each of the active switches, wherein
each of the active switches comprises a metal layer; and
a hollow structure disposed through the transparent conductive layer, and located in an overlapping region between the transparent conductive layer and the metal layer;
wherein the metal layer includes a drain metal layer, and the transparent conductive layer includes a connection section connected to the drain metal layer; and the hollow structure includes a hollowed structure located in an overlapping region between the connection section and the drain metal layer;
wherein the drain metal layer and the hollowed structure are circular;
wherein the drain metal layer and the hollowed structure are concentric circles.

2. The array substrate according to claim 1, wherein the array substrate includes a data line, and the metal layer includes a source metal layer connected to the data line; and the transparent conductive layer includes another connection section, and the hollow structure includes another hollowed structure located in an overlapping region between the other connection section and the source metal layer.

3. The array substrate according to claim 2, wherein the source metal layer is circular, and the other hollowed structure is symmetrical with respect to a radial direction of the source metal layer.

4. The array substrate according to claim 2, wherein the other hollowed structure is at a middle position of the other connection section.

5. The array substrate according to claim 2, wherein a shape of the other hollowed structure includes a polygonal shape.

6. The array substrate according to claim 2, wherein a shape of the other hollowed structure includes an arc shape.

7. The array substrate according to claim 1, wherein the array substrate includes a passivation layer located above the drain metal layer,
and the passivation layer includes a through hole,
and the drain metal layer includes a recess, wherein
the connection section is connected to and fixed in the recess by passing through the through hole.

8. The array substrate according to claim 1, wherein a shape of the hollowed structure includes a polygonal shape.

9. The array substrate according to claim 1, wherein a shape of the hollowed structure includes an arc shape.

10. An array substrate, comprising:
a substrate;
a plurality of active switches formed above the substrate; and
a transparent conductive layer formed above the active switches and connected to each of the active switches, wherein
each of the active switches comprises a metal layer; and
a hollow structure disposed through the transparent conductive layer and located in an overlapping region between the transparent conductive layer and the metal layer, wherein
the array substrate comprises a data line, and the metal layer comprises a source metal layer and a drain metal layer, the source metal layer being connected to the data line; the transparent conductive layer comprises a first connection section, a second connection section, and a pixel electrode, the second connection section being connected to the drain metal layer, and being connected to the pixel electrode through the first connection section; the hollow structure comprises a first hollow structure and a second hollow structure, the first hollow structure being located in an overlapping region between the first connection section and the source metal layer, and the second hollow structure being located in an overlapping region between the second connection section and the drain metal layer; and
the array substrate further comprises a passivation layer located above the drain metal layer and comprising a through hole, and the drain metal layer comprises a recess, wherein the second connection section connected to and fixed in the recess by passing through the through hole, wherein
the drain metal layer and the second hollow structure are circular;
the drain metal layer and the second hollow structure are concentric circles;
the source metal layer is circular, and the first hollow structure is symmetrical with respect to a radial direction of the source metal layer;
a shape of the first hollow structure is a strip; and
the first hollow structure is at a middle position of the first connection section.

11. A display panel, comprising an array substrate, wherein the array substrate comprises:
a substrate;
a plurality of active switches formed above the substrate; and
a transparent conductive layer formed above the active switches and connected to each of the active switches, wherein
each of the active switches comprises a metal layer; and
a hollow structure disposed through the transparent conductive layer and located in an overlapping region between the transparent conductive layer and the metal layer;
wherein the metal layer includes a drain metal layer, and the transparent conductive layer includes a connection section connected to the drain metal layer; and the hollow structure includes a hollowed structure located in an overlapping region between the connection section and the drain metal layer;
wherein the drain metal layer and the hollowed structure are circular;
wherein the drain metal layer and the hollowed structure are concentric circles.

12. The display panel according to claim 11, wherein the array substrate includes a data line, and the metal layer includes a source metal layer connected to the data line; and the transparent conductive layer includes another connection section, and the hollow structure includes another hollowed structure located in an overlapping region between the other connection section and the source metal layer, wherein
a shape of the other hollowed structure is set to a polygonal shape, a strip shape, an arc shape, or a combination of the above shapes.

13. The display panel according to claim 11, wherein
a shape of the hollowed structure is set to a polygonal shape, a strip shape, an arc shape, or a combination of the above shapes.

* * * * *